US010386869B2

(12) United States Patent
Meeuwsen (10) Patent No.: US 10,386,869 B2
(45) Date of Patent: *Aug. 20, 2019

(54) AUTOMATED SYSTEM TO DETERMINE VARIABLE FREQUENCY DRIVE SKIP FREQUENCY BANDS FOR VIBRATION CONTROL

(71) Applicant: TRANE INTERNATIONAL INC., Davidson, NC (US)

(72) Inventor: Gregory L. Meeuwsen, West Salem, WI (US)

(73) Assignee: TRANE INTERNATIONAL INC., Davidson, NC (US)

( * ) Notice: Subject to any disclaimer, the term of this patent is extended or adjusted under 35 U.S.C. 154(b) by 85 days.

This patent is subject to a terminal disclaimer.

(21) Appl. No.: 15/810,258

(22) Filed: Nov. 13, 2017

(65) Prior Publication Data
US 2018/0129231 A1 May 10, 2018

Related U.S. Application Data

(63) Continuation of application No. 14/447,100, filed on Jul. 30, 2014, now Pat. No. 9,817,408.
(Continued)

(51) Int. Cl.
*G05D 19/02* (2006.01)
*G06F 17/50* (2006.01)
*F16F 15/00* (2006.01)

(52) U.S. Cl.
CPC ............ *G05D 19/02* (2013.01); *F16F 15/002* (2013.01); *G06F 17/50* (2013.01)

(58) Field of Classification Search
CPC .......... G05D 19/02; G06F 17/50; F16F 15/002
See application file for complete search history.

(56) References Cited

U.S. PATENT DOCUMENTS

| 5,005,439 A | 4/1991 | Jensen et al. |
| 5,196,775 A * | 3/1993 | Harris .................... H02P 6/185 |
| | | 318/607 |

(Continued)

FOREIGN PATENT DOCUMENTS

WO 2013/059764 4/2013

OTHER PUBLICATIONS

Devi et al., "A Comparative Study Between Vibration and Acoustic Signals in HTC Cooling Pump and Chilling Pump", Jun. 2010, IACSIT, Intl Journal of Engineering and Technology, vol. 2, No. 3, ISSN: 1793-8236. (Year: 2010).*

(Continued)

*Primary Examiner* — Mohammad Ali
*Assistant Examiner* — Kelvin Booker
(74) *Attorney, Agent, or Firm* — Hamre, Schumann, Mueller & Larson, P.C.

(57) ABSTRACT

A vibration control system for a variable speed cooling system includes a programmable controller in communication with a variable frequency drive (VFD). The programmable controller is programmed to command the VFD to operate at frequencies only outside of one or more frequency lockout bands automatically calculated by the programmable controller based on a comparison of newly acquired variable speed cooling system vibration data with previously stored variable speed cooling system vibration specification data.

12 Claims, 6 Drawing Sheets

Related U.S. Application Data (60) Provisional application No. 61/859,952, filed on Jul. 30, 2013.

(56) References Cited

U.S. PATENT DOCUMENTS

| | | | |
|---|---|---|---|
| 5,203,178 A | 4/1993 | Shyu | |
| 5,237,618 A * | 8/1993 | Bethel | G10K 11/178 381/71.2 |
| 5,820,348 A | 10/1998 | Fricke | |
| 6,018,957 A | 2/2000 | Katra et al. | |
| 6,102,221 A | 8/2000 | Habisohn | |
| 7,050,873 B1 | 5/2006 | Discenzo | |
| 7,341,201 B2 | 3/2008 | Stanimirovic | |
| 7,743,617 B2 | 6/2010 | Crane et al. | |
| 7,770,806 B2 | 8/2010 | Herzon et al. | |
| 8,111,028 B2 | 2/2012 | Rollins et al. | |
| 8,126,574 B2 | 2/2012 | Discenzo et al. | |
| 8,188,698 B2 | 5/2012 | Rollins et al. | |
| 8,532,828 B2 * | 9/2013 | Schramm | F16H 57/0006 700/280 |
| 10,240,839 B2 * | 3/2019 | Sykora | F25B 49/022 |
| 2004/0219079 A1 | 11/2004 | Hagen et al. | |
| 2006/0198744 A1 * | 9/2006 | Lifson | F04B 17/03 417/423.1 |
| 2007/0040871 A1 * | 2/2007 | Urano | B41J 11/42 347/68 |
| 2007/0156289 A1 | 7/2007 | Alfieri et al. | |
| 2008/0041076 A1 | 2/2008 | Tutunoglu et al. | |
| 2008/0041077 A1 | 2/2008 | Tutunoglu | |
| 2008/0245083 A1 | 10/2008 | Tutunoglu et al. | |
| 2009/0093911 A1 | 4/2009 | Caillat | |
| 2009/0241771 A1 | 10/2009 | Manning et al. | |
| 2010/0045228 A1 | 2/2010 | Rollins et al. | |
| 2010/0110626 A1 | 5/2010 | Schmitt et al. | |
| 2010/0112925 A1 | 5/2010 | Schmitt et al. | |
| 2010/0114356 A1 | 5/2010 | Schmitt et al. | |
| 2010/0141193 A1 | 6/2010 | Rotondo et al. | |
| 2010/0170277 A1 | 7/2010 | Schmitt et al. | |
| 2010/0217543 A1 | 8/2010 | Bougaev et al. | |
| 2011/0041532 A1 * | 2/2011 | Preston | F25B 49/027 62/186 |
| 2011/0138826 A1 | 6/2011 | Lifson et al. | |
| 2012/0011849 A1 | 1/2012 | Cole et al. | |
| 2013/0112392 A1 | 5/2013 | Karpinski | |
| 2013/0278183 A1 | 10/2013 | Liang et al. | |
| 2014/0098487 A1 | 4/2014 | Hartman et al. | |
| 2014/0244051 A1 | 8/2014 | Rollins et al. | |
| 2014/0261714 A1 | 9/2014 | Burt | |
| 2015/0039139 A1 * | 2/2015 | Meeuwsen | G05D 19/02 700/280 |
| 2015/0059345 A1 | 3/2015 | Hellat | |
| 2015/0292490 A1 | 10/2015 | Cole et al. | |
| 2015/0377537 A1 * | 12/2015 | West | F25B 13/00 62/115 |
| 2016/0003541 A1 * | 1/2016 | Plavnik | F26B 5/02 34/401 |
| 2016/0069624 A1 | 3/2016 | Rollins et al. | |
| 2016/0293314 A1 * | 10/2016 | Wang | H01F 7/085 |
| 2017/0019039 A1 * | 1/2017 | Skinner | H02P 6/08 |

OTHER PUBLICATIONS

Manz et al., "Mating New Variable Frequency Drives to Existing Motors", Mar. 1, 1999, Retrieved from the Internet on Mar. 26, 2019 at "www.ecmweb.com/design/mating-new-variable-frequency-drives-existing-motors". (Year: 1999).*

Qureshi, T.Q. and Tassou, S.A., "Variable-Speed Capacity Control in Refrigeration Systems", Feb. 17, 1995, Applied Thermal Engineering, vol. 16, No. 2, pp. 103-113.

* cited by examiner

AUTOMATED SYSTEM TO DETERMINE VARIABLE FREQUENCY DRIVE SKIP FREQUENCY BANDS FOR VIBRATION CONTROL

FIELD

The embodiments described herein relate generally to cooling systems such as refrigeration and heating, ventilation, and air conditioning (HVAC) systems that may employ compressors, motors and fans, for example. More particularly, the embodiments described herein relate to a system and method for automatically reducing or eliminating excessive vibration and/or excessive noise caused by structural resonances within a cooling system.

BACKGROUND

Variable speed drive (VFD) systems, such as those that may be employed in association with motors, fans and compressors, often by necessity must pass through frequencies that excite structural resonances. The resonances can lead to structural failure of motor bearings, fan supports and refrigerant piping, customer complaints about excessive vibration, or excessive noise.

Many variable speed motor applications accomplished by a VFD are prone to vibration problems within the desired speed range due to resonances and critical speeds. Products that may be adversely impacted include, without limitation, fans, motors, refrigeration compressors and air compressors.

SUMMARY

It is often impractical or cost prohibitive to design a structure such that any resonant vibration meets design criteria at all possible speeds. Designing a structure to avoid resonances can require, for example, significant engineering resources and adds product cost.

Another solution for this occurrence is often to program lockout bands or stop bands into the VFD controls during product manufacture. Such solutions are problematic in that determining the appropriate lockout bands can be time consuming; and the width of the lockout bands can become excessively large to account for manufacturing variations of resonant frequencies of a particular system.

Most VFD systems have such programming capabilities; however the programming is manual and an installer must program the desired lockout band frequencies via a keypad. Such manual programming is problematic since the installer requires knowledge of the programmable frequencies.

Further, any such manual programming performed in a factory on a product line requires knowledge of the frequencies to program for each unit size and option configuration. Factory programming further must take into consideration normal production variations, which may be significant. Such factory programmed frequencies therefore can be considerably wider than necessary for most product configurations, leaving less usable range and degrading controllability.

Although each product configuration may be tested individually, doing so usually involves complex instrumentation and analysis. Further, each unit would require a qualified vibration technician during the run-in for each unit. Such individual testing therefore can disadvantageously add significant time to the run-test process.

In view of the foregoing, there is a need for a system and method for automatically determining lockout band frequencies on a production basis for a plurality of cooling product configurations such that each product configuration that employs a VFD can be automatically programmed with VFD lockout/stop/skip band frequencies tailored to the particular product configuration to limit the effects of production variations. The system and method should be fast and simple to implement, which can reduce the need for special training or expertise that may be involved for example with manual programming and individual testing.

According to one embodiment, a simple algorithm is implemented in a software based cooling system. Vibration sensors are mounted at a key location(s) on the structural system (e.g. on one or more variable speed fans, variable speed motor bearings, and/or refrigerant tubing elbows, for example). A multi-channel data acquisition system acquires the sensor output signals and communicates with a controller/computer that calculates vibration level(s) during a frequency sweep. The controller/computer communicates to a VFD, for example over an appropriate interface such as, without limitation, an RS-485 interface or a USB interface, and causes it to slowly sweep the variable speed motor(s) over the full product frequency range. The controller/computer simultaneously controls and acquires vibration level data from the data acquisition system. The acquired vibration level versus speed curve is compared against an engineering specification. Using simple amplitude and rate of change information, the frequency bands over which the specification is exceeded is determined. These frequency bands are then communicated back to the VFD as lockout/stop bands.

The stop band may optionally be made wider based on how the measured resonance is expected to shift over time for example due to wear or aging. Further, the stop band may be based upon a calculated Q factor of the resonance. For example, the stop band may be set to the wider of the level that exceeds the specification or the half-power bandwidth of the resonance. In addition, expert rules may further be programmed into the controller/computer to detect common faults, such as fan out of balance, bad or missing transducers and loose transducers According to another embodiment, a method of operating a variable frequency drive (VFD) system associated with a product configured with refrigeration and/or HVAC variable speed fans and/or variable speed compressors comprises establishing an initial vibration sensor configuration associated with a predetermined product configuration that employs at least one motor controlled via a VFD. One or more predetermined vibration sensors are then installed in accordance with the initial vibration sensor configuration on any product having the predetermined product configuration. A programmable controller or computing device commands the VFD to slowly sweep the motor for example over the full product frequency range. The controller/computing device may be integrated with the programmable VFD or distinct from the programmable VFD and automatically acquires vibration data from the vibration sensors via a multi-channel data acquisition system during the frequency sweep to yield vibration level/amplitude and speed/rate of change data. The acquired data is compared with a table of amplitude and rate of change data stored in a memory location associated with the controller/computing device to determine frequencies or frequency bands over which a vibration specification is exceeded. Such frequencies and/or frequency bands are then communicated to the VFD by the computing device as lockout bands. The automatically tested product subsequently is installed and operated for example over the full product frequency range outside the lockout bands.

The computing device may be further programmed with expert rules to detect common faults, including without limitation, fan out of balance, bad or missing transducers and loose transducers during the foregoing frequency sweep.

According to yet another embodiment, a test system for a refrigeration or air conditioning product comprising one or more variable speed fan motors and/or one or more variable speed compressor motors that are controlled via a singular or distributed variable frequency drive (VFD) comprises a controller/computer programmed to automatically control the VFD based on frequency lockout bands to avoid excessive vibration and noise within a desired speed range due to resonant frequencies. The test system further comprises one or more predetermined vibration sensors installed at predetermined locations within the product. The controller/computer is programmed to command the VFD to slowly sweep the motor(s) for example over the full product frequency range and automatically acquire vibration amplitude and rate of change data from the vibration sensor(s) via a multi-channel data acquisition system during the frequency sweep. Programmed frequency lockout bands are then based on a comparison of the acquired data with a predetermined data or set of data associated with the tested product and stored in a memory location integrated with the tested product.

According to still another embodiment, a test system for a refrigeration or air conditioning product comprising at least one variable speed motor controlled via a variable frequency drive (VFD) comprises a controller/computer programmed to automatically control the VFD with frequency lockout bands to avoid excessive vibration and noise within a desired speed range due to resonant frequencies. At least one vibration sensor is installed at a predetermined location on or within the product. The controller/computer is programmed to command the VFD to slowly sweep at least one variable speed motor over a predetermined frequency range and automatically acquire vibration amplitude and rate of change data from the at least one vibration sensor via a data acquisition system during the frequency sweep. The programmed frequency lockout bands are then based on a comparison of the acquired data with a predetermined set of data associated with the tested product and stored in a memory location integrated with the tested product.

DRAWINGS

These and other features, aspects, and advantages of the systems and methods to address excessive vibration and noise will become better understood when the following detailed description is read with reference to the accompanying drawing, wherein.

While the above-identified drawing figures set forth particular embodiments of systems and methods to address excessive vibration and noise, other embodiments are also contemplated, as noted in the discussion. In all cases, this disclosure presents illustrated embodiments of the systems and methods by way of representation and not limitation. Numerous other modifications and embodiments can be devised by those skilled in the art which fall within the scope and spirit of the principles of systems and methods described herein.

DETAILED DESCRIPTION

Figure 1:
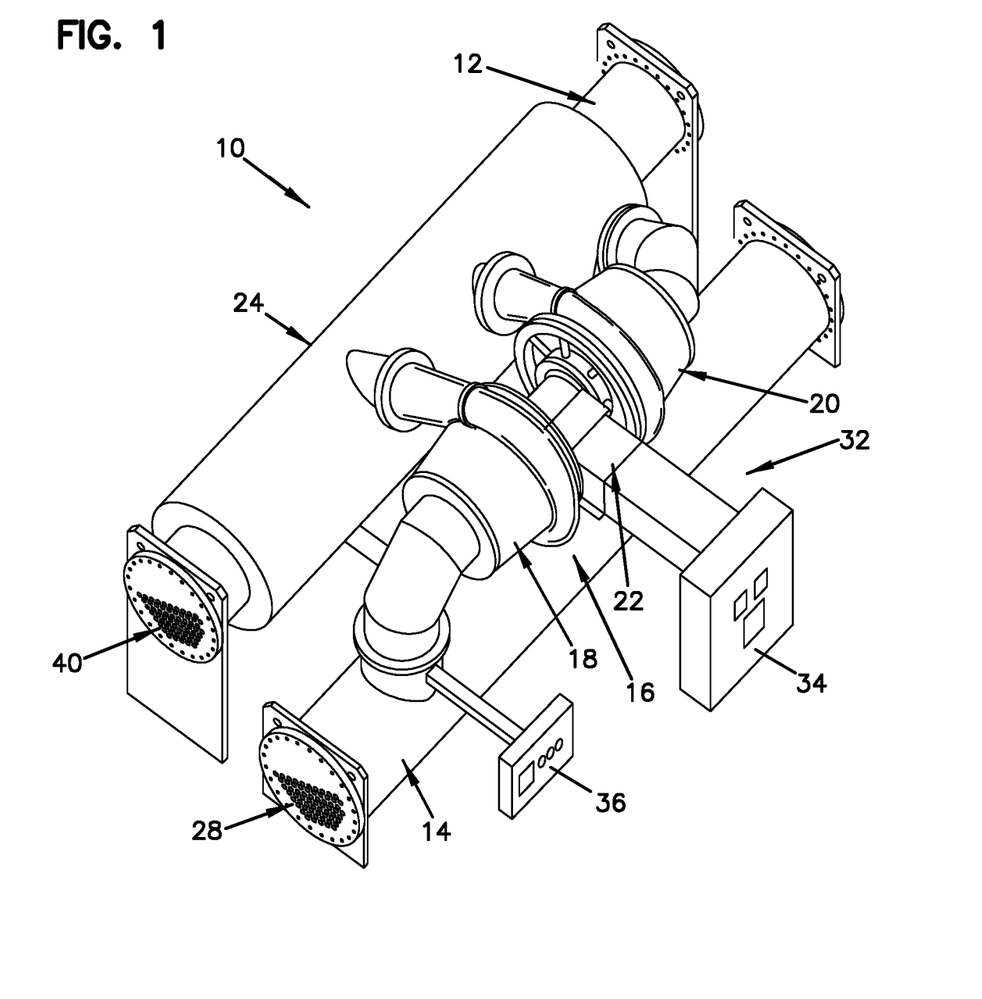
FIG. 1 illustrates a perspective view of a chiller system and the various components that are known in the prior art.
Figure 2:
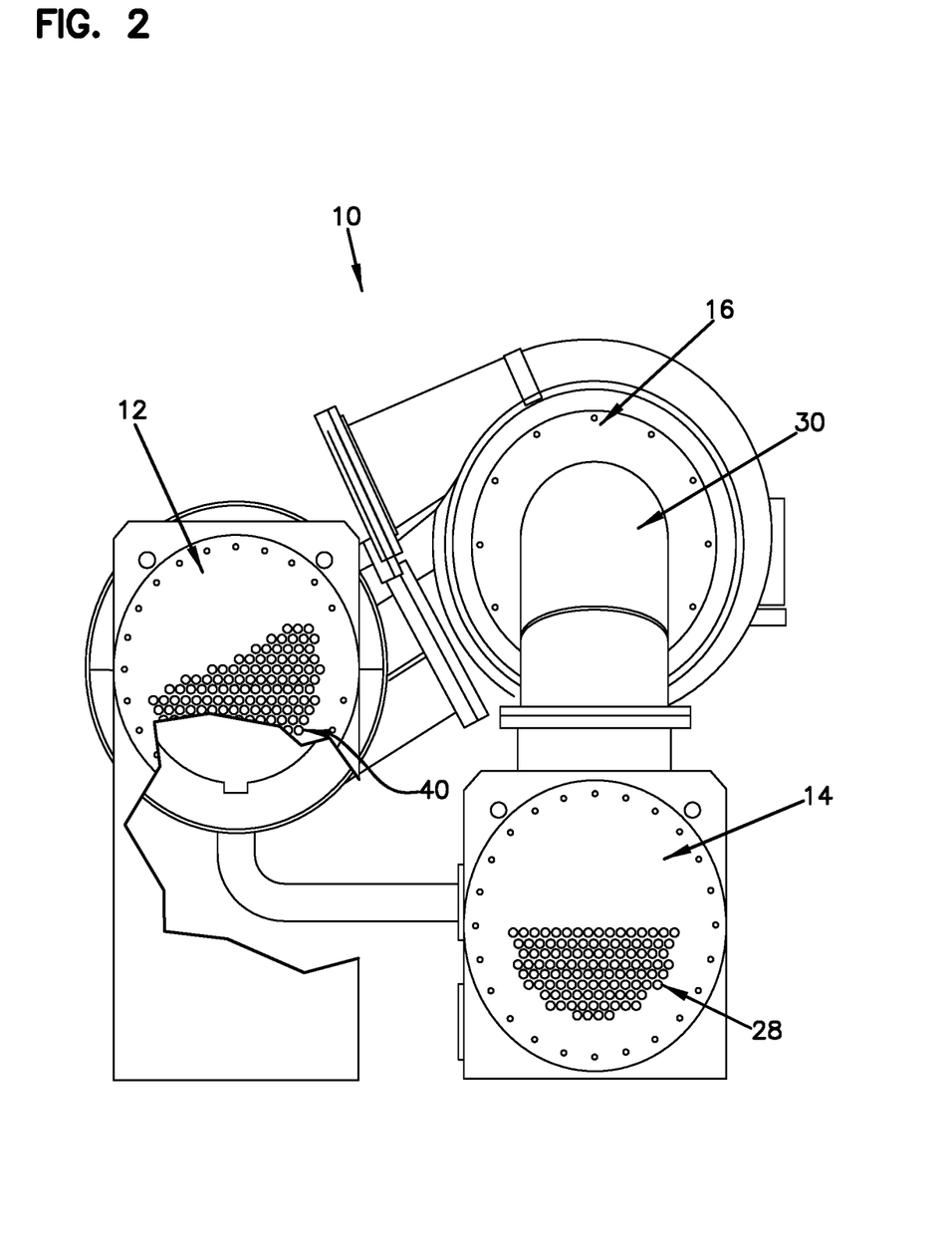
FIG. 2 illustrates an end, cut away view of the chiller system depicted in FIG. 1 showing tubing arrangements for the condenser and evaporator.

FIG. 1 illustrates a perspective view of one example of a centrifugal chiller system 10 for implementing a refrigeration system and the various associated components that are known in the prior art; while FIG. 2 illustrates an end, cut away view of the chiller system 10 depicted in FIG. 1 showing tubing arrangements for a condenser 12 and evaporator 14. The chiller system 10 includes many other conventional features not depicted for simplicity of the drawings. Further, as a preface to the detailed description, it should be noted that, as used herein, the singular forms "a," "an," and "the" include plural referents, unless the context clearly dictates otherwise.

The chiller system 10 comprises an evaporator 14, multi-stage compressor 16 having a first stage compressor 18 and a second stage compressor 20 that may be driven by any suitable variable speed, direct drive motor 22, and a coaxial economizer 24 with a condenser 12.

Figure 4:
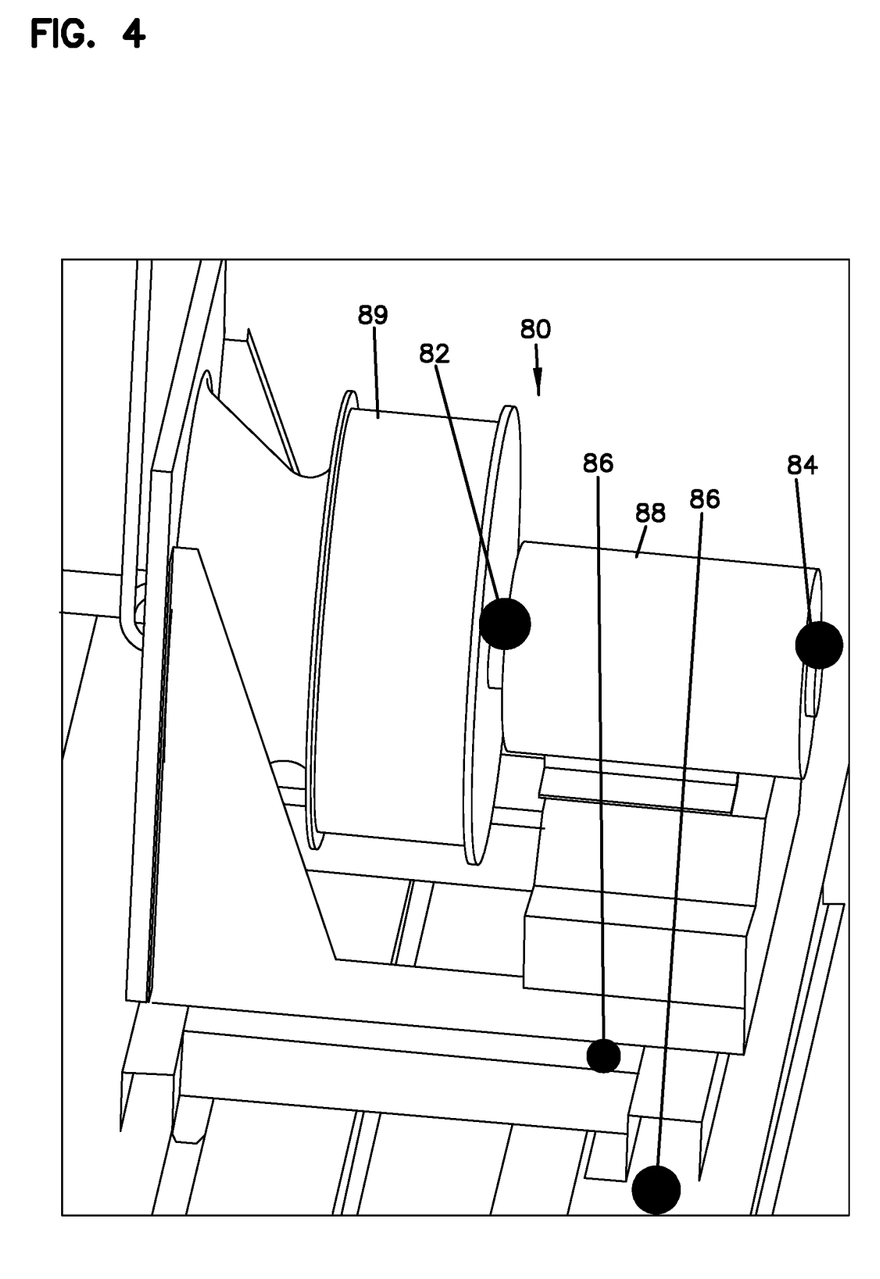
FIG. 4 illustrates placement of vibration sensors associated with a direct drive plenum fan, according to one embodiment.
Figure 5:
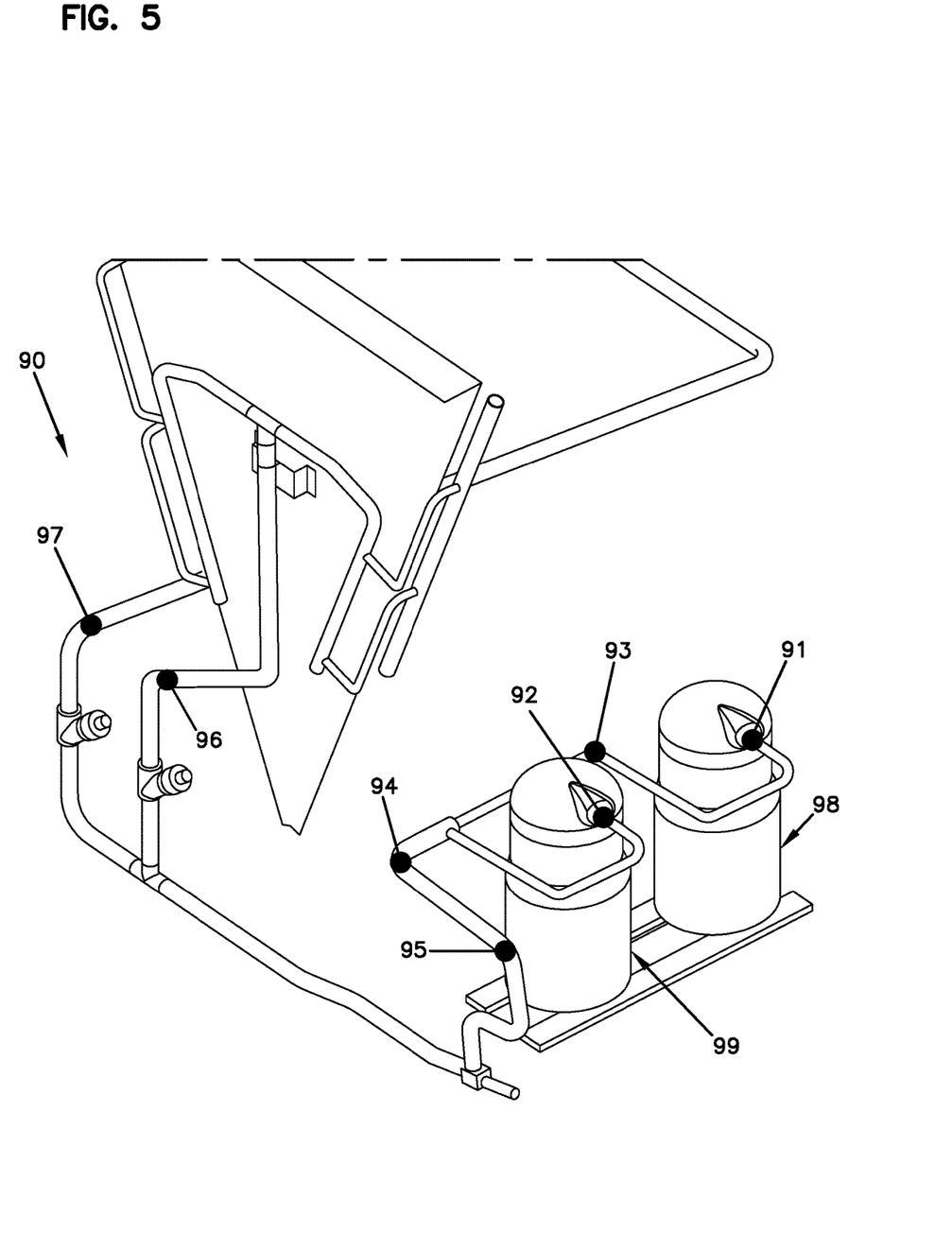
FIG. 5 illustrates placement of vibration sensors associated with refrigerant piping in a scroll compressor system, according to one embodiment.

While the principles described herein would be applicable to this chiller system 10 if there were known compressor vibration problems, the principles described herein can also be applied to refrigerant piping vibration in scroll compressor systems in chillers and unitary products, where the primary concern may be piping fatigue, such as described in more detail herein with reference to FIGS. 4 and 5.

Other applications in which the principles described herein may be suitably applied are directed to piping connected to screw compressor systems in chillers, where the primary concern is mainly acoustic noise generation, as well as fans in air handlers and unitary products. Further, the principles described herein may be applicable to pump and pump piping vibration.

The compressor 16 is typically an electric motor driven unit. A variable speed drive system 32 drives the compressor 16. The variable speed drive system 32 comprises a motor 22 located for example in between the first stage compressor 18 and the second stage compressor 20 and a variable speed drive/variable frequency drive (VFD) 34 having power electronics.

Such motor 22 can comprise a direct drive, variable speed, hermetic motor. The speed of the motor 22 can be controlled by varying the frequency of the electric power that is supplied to the motor 22. The motor 22 is under the control of the VFD 34.

The VFD 34 can include an electrical power converter comprising a line rectifier and line electrical current harmonic reducer, power circuits and control circuits (such circuits further comprising all communication and control logic, including electronic power switching circuits). The VFD 34 can respond, for example, to signals received from a microprocessor integrated within a control panel 36 to increase or decrease the speed of the motor 22 by changing the frequency of the current supplied to motor 22. That is, the speed of motor 22 can be varied to match changing system requirements.

According to one embodiment, operation of the first and second stage compressors 18, 20, and the chiller system 10 generally, is controlled by, for example, a microcomputer control panel 36 in connection with sensors located within the chiller system 10 that allows for the reliable operation of the chiller, including display of chiller operating conditions. Other controls may be linked to the microcomputer control panel 36, such as: compressor controls; system supervisory controls that can be coupled with other controls to improve efficiency; soft motor starter controls; controls for regulating guide vanes and/or controls to avoid system fluid surge; control circuitry for the motor or variable speed drive 34; and other sensors/controls are contemplated as should be understood. It should be apparent that software may be provided in connection with operation of the variable speed drive and other components of the chiller system 10, for example.

Figure 3:
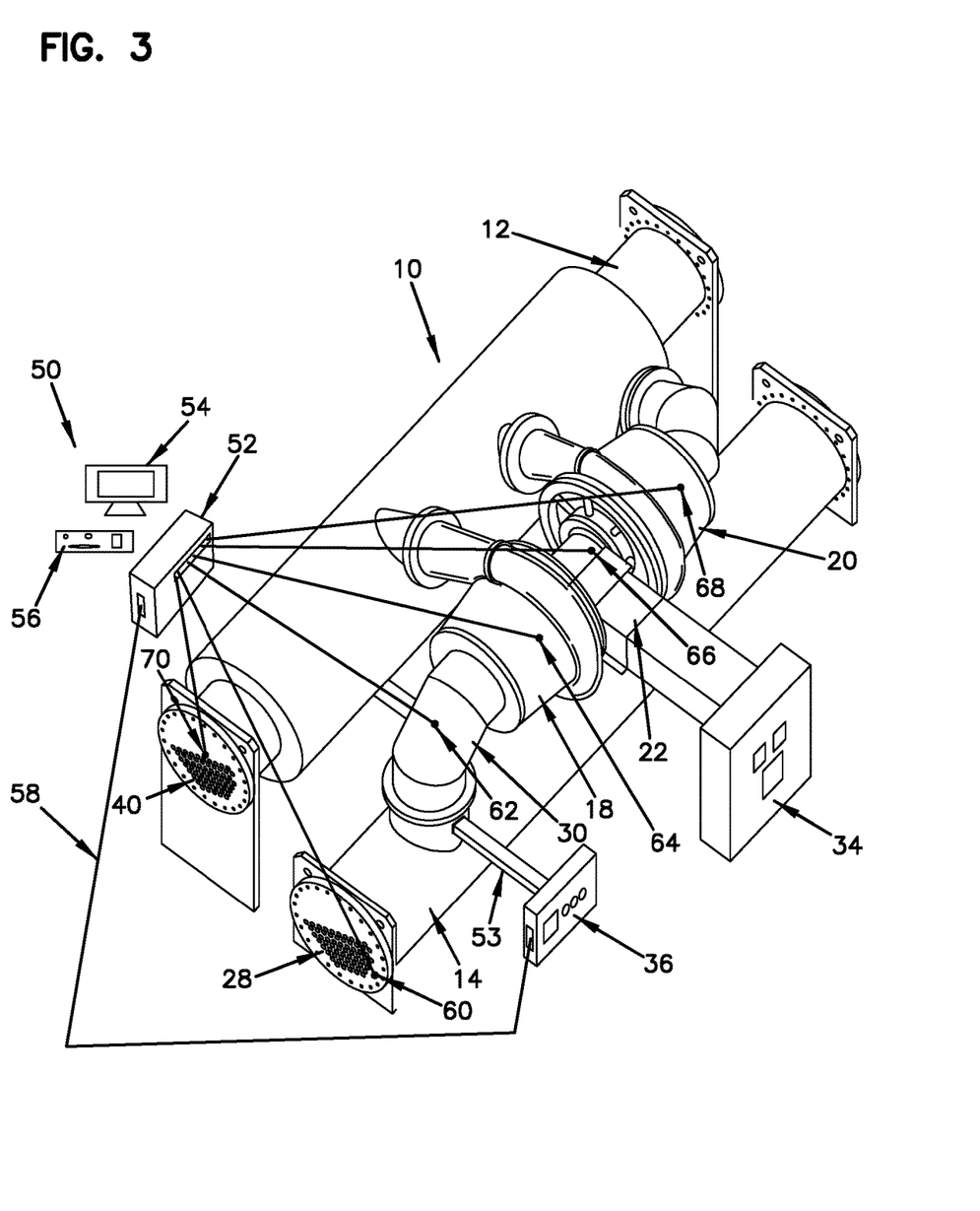
FIG. 3 illustrates a vibration test system for the chiller system shown in FIGS. 1 and 2, according to one embodiment.

FIG. 3 illustrates a vibration control/test system 50 for the chiller system 10 shown in FIGS. 1 and 2, according to one embodiment. The vibration control/test system 50 may communicate with the VFD 34, for example via an RS-485 interface or a USB interface, among others. The RS-485 interface is based on the EIA-485 standard defining electrical characteristics of drivers and receivers for use in balanced digital multipoint systems. The standard is published by the Telecommunications Industry Association/Electronic Industries Alliance (TIA/EIA). Digital communications networks implementing the EIA-485 standard can be used effectively over long distances and in electrically noisy environments. Multiple receivers may be connected to such a network in a linear, multi-drop configuration. These characteristics make such networks useful in industrial environments and similar applications.

Some applications of variable speed motors such as the direct fan drive system 80 illustrated in FIG. 4 and the scroll compressor system 90 illustrated in FIG. 5 may be prone to vibration problems within the desired motor speed range due to resonances and critical speeds when controlled via a VFD 34, such as that depicted in FIGS. 1-3. The details of FIGS. 4 and 5 are discussed below. The embodied vibration control/test system 50 described with reference to FIG. 3 advantageously avoids such vibration problems by automatically programming the programmable VFR controller 34 with appropriate lockout/stop bands for the VFD, as described herein. It will be appreciated that although vibration sensors are described herein with reference to particular locations, numerous other locations are possible and may be even more desirable depending upon the particular system configurations and applications.

With continued reference to FIG. 3, one embodiment the vibration control/test system 50 may employ a multi-channel data acquisition system 52 programmed to acquire vibration sensor output signals and calculate vibration levels therefrom. An external display unit 54 and keyboard 56 may, for example, optionally be employed to program or otherwise configure the data acquisition system 52 and to display sensor data in real time.

The embodied vibration test system 50 can further comprise an evaporator 14 coil 28 vibration sensor 60, a suction inlet pipe 30 vibration sensor 62, a first stage compressor 18 vibration sensor 64, a variable speed motor 22 vibration sensor 66, a second stage compressor 20 vibration sensor 68 and a condenser 12 coil 40 vibration sensor 70. It will be appreciated that vibration sensor mounting locations can vary and may be dependent upon the particular refrigeration or HVAC conditioning system configuration and application, as stated herein. Exemplary mounting locations may include, for example and without limitation, on fans, compressors, motors and motor bearings, and refrigerant tubing elbows.

The control panel/controller 36 that includes the data processing device(s), e.g. CPU, DSP, etc., and vibration sensor interface hardware is programmed with algorithmic software enabling the programmable control panel/controller 36 to communicate commands to the VFD 34 via a communication bus 53 such as for example but not limited to an RS-485 interface. According to one embodiment, algorithmic software commands are communicated to the VFD 34 causing the VFD 34 to slowly sweep the motor 22 over the full chiller system 10 operating speed/frequency range. The programmable control panel/controller 36 simultaneously acquires vibration level/amplitude data from the vibration data acquisition system 52 via a dedicated communication bus 58 during the frequency sweep. A resultant vibration level versus speed curve is then compared against engineering specification data stored in a memory location/device in the programmable control panel/controller 36. Simple amplitude and rate of change information are then used to determine frequency bands over which the specification is exceeded. These frequency bands are then communicated back to the VFD 34 as frequency lockout/stop bands.

It will be appreciated that vibration output signal anomalies may result from common faults such as, without limitation, out of balance fans, bad or missing transducers and loose transducers, for example. Expert rules accounting for such predetermined anomalies may further be programmed into the control panel/controller 36 allowing a system operator to disregard an anomaly, to correct an anomaly, and/or adjust the frequency lockout bands in response thereto.

In operation, for example, a process starts to extract the vibration amplitude at the fundamental rotating speed of the component of interest—e.g. abbreviated as 1× rpm, and then integrating that acceleration signal into the parameter of interest—velocity for fans and displacement for refrigerant piping. The expert rules here involve comparing the 1× rpm value against various criteria. If the component is a fan, then the value can be compared to the manufacturing criteria for imbalance vibration. If the value is below a minimum threshold, this could indicate for example a missing or faulty transducer or signal path. Loose transducer anomalies may be ascertained, for example by developing a database of out-of-band energy over time, and flag an operator if it may be observed to be excessive. The operator or an engineer could then diagnose the problem using the vibration spectral data the system will record.

Keeping the foregoing principles in mind, FIG. 4 illustrates placement of vibration sensors 82, 84, 86 associated with a direct drive plenum fan system 80, according to one embodiment. A vibration test system such as the test system 50 described with reference to FIG. 3 may be employed to determine frequency bands over which a desired or predetermined specification is exceeded for the direct drive plenum fan system 80.

The direct drive plenum fan system 80 may have, for example, a vibration sensor 82 attached to a fan end motor bearing, another vibration sensor 84 attached to the opposite end motor bearing, and yet one or more vibration sensors 86 attached to the fan base. A programmable control panel/controller such as controller 36 described with reference to FIG. 3 is programmed with algorithmic software and communicates commands to a VFD such as VFD 34, also described herein with reference to FIG. 3.

Software commands are communicated to the VFD in response to the algorithmic software, causing the VFD to slowly sweep the motor 88 for example over the full direct drive plenum fan 89 operating speed/frequency range. The controller simultaneously acquires vibration level/amplitude data during the frequency sweep from a vibration data acquisition system that is interfaced to the vibration sensors 82, 84, 86 such as the vibration data acquisition system 52 described with reference to FIG. 3. A resultant vibration level versus speed curve is then compared against engineering specification data stored in a predetermined memory location. Simple amplitude and rate of change information are then used to determine frequency bands over which the specification is exceeded. These frequency bands are then communicated back to the VFD as frequency lockout/stop bands, allowing the VFD to control the motor/fan/compressor speeds in a fashion that avoids operation in frequency bands over which the specification is exceeded.

FIG. 5 illustrates placement of vibration sensors 91-97 associated with refrigerant piping in a scroll compressor system 90, according to one embodiment. A vibration test system such as the test system 50 described with reference to FIG. 3 may be employed to determine frequency bands over which a desired or predetermined specification is exceeded for the scroll compressor system 90. The scroll compressor system 90 may have, for example, a vibration sensor 91 attached to a first scroll compressor discharge, another vibration sensor 92 attached to another scroll compressor discharge, yet additional vibration sensors 93-97 attached to various refrigerant piping elbows.

A programmable control panel/controller such as controller 36 described with reference to FIG. 3 is programmed with algorithmic software and communicates commands to a VFD such as VFD 34, also described herein with reference to FIG. 3. Software commands are communicated to the VFD in response to the algorithmic software, causing the VFD to slowly sweep the respective compressor drive motors 98, 99 for example over the full scroll compressor operating speed/frequency ranges.

The controller simultaneously acquires vibration level/amplitude data during the frequency sweep from a vibration data acquisition system that is interfaced to the vibration sensors 91-97 such as the vibration data acquisition system 52 described with reference to FIG. 3. A resultant vibration level versus speed curve is then compared against engineering specification data stored in a predetermined memory location. Simple amplitude and rate of change information are then used to determine frequency bands over which the specification is exceeded. These frequency bands are then communicated back to the VFD as frequency lockout/stop bands, allowing the VFD to control the motor/compressor speeds in a fashion that avoids operation in frequency bands over which the specification is exceeded.

Figure 6:
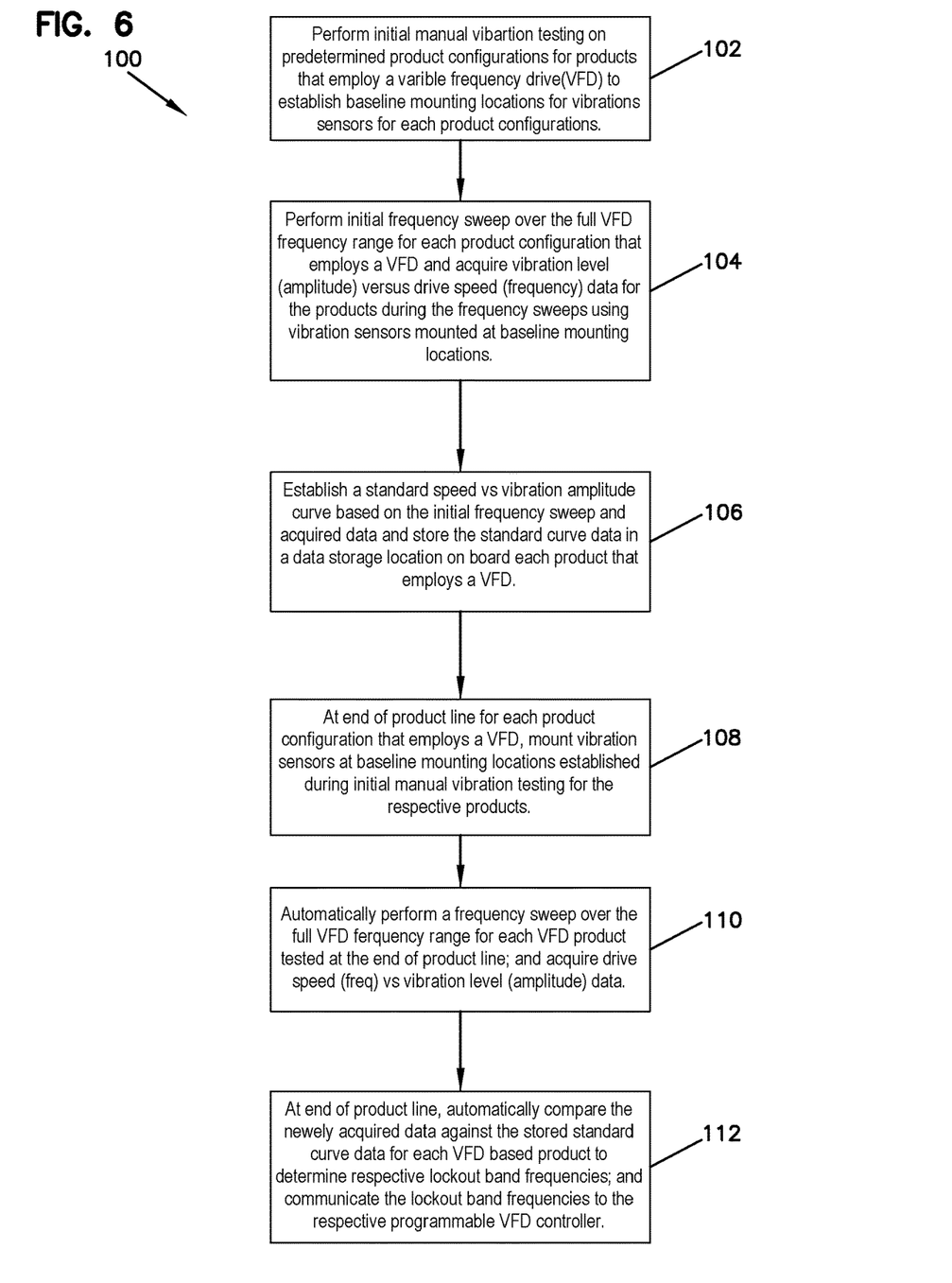
FIG. 6 is a flow chart illustrating a method of operating a vibration test system, according to one embodiment.

FIG. 6 is a flow chart illustrating a method 100 of operating for example the vibration test system 50 depicted in FIG. 3, according to one embodiment. The embodied method 100 is directed to an automated process to determine vibration characteristics associated with each individual VFD based product configuration and to program the associated VFD with appropriate frequency lockout bands. According to one embodiment, the automated process can be performed at a factory end-of-line production run-in stand. A test system operator may be required to only mount vibration sensors at predetermined mounting locations and then to initiate the automated process.

With continued reference to FIG. 6, each VFD based product configuration to be subjected to automated testing may first undergo manual vibration testing to establish preferred vibration sensor mounting locations, as represented in block 102. Suitable vibration sensor mounting locations may be those locations that are most responsive to system vibration at and/or near resonant frequencies caused by the respective system configuration(s). Exemplary vibration sensor locations are illustrated in FIGS. 3, 4 and 5.

Subsequent to installation of vibration sensors at the preferred mounting locations, the system to be vibration tested is initially subjected to a frequency sweep for example of its full VFD operating frequency range, as represented in block 104. Vibration level/amplitude data is acquired during the initial frequency sweep. The speed/frequency data is plotted against the resultant frequency/amplitude data to generate a standard curve/engineering standard that is stored in each VFD based product having a like system configuration. Each subsequent product configured with a VFD then is programmed with algorithmic software including a respective engineering standard to provide automated system testing to determine VFD skip/lockout/stop frequency bands for vibration control, as represented in block 106.

A cooling system such as a refrigeration or HVAC system that employs a VFD and that is programmed with algorithmic test software including a respective engineering standard as described herein, may then undergo automated vibration testing at the end of its manufacturing assembly. The automated testing method commences by first mounting vibration sensors at established preferred mounting locations, as represented in block 108.

Subsequent to installation of vibration sensors, the automated testing process is initiated by activating the test routine programmed into the control panel/controller, causing programmed algorithmic software commands to be communicated to the VFD thus causing the VFD to slowly sweep the motor/fan/compressor for example over the full operating speed/frequency range. The programmable control panel/controller can simultaneously acquire vibration level/amplitude data from the vibration data acquisition system during the frequency sweep as represented by block 110. A resultant vibration level versus speed curve is then compared against engineering specification data stored in a predetermined memory location/device. Simple amplitude and rate of change information are then used to determine frequency bands over which the specification is exceeded. These frequency bands are then stored in a respective memory location and communicated back to the VFD as frequency lockout/stop bands during operation of the system, as represented by block 112.

In summary explanation, embodiments of an automated system and method employ vibration sensors mounted at key location(s) on a structural system. The key locations may include without limitation, on fan and motor bearings and on refrigerant tubing elbows associated with a refrigeration or air conditioning system that employs a VFD. A multi-channel data acquisition system acquires the vibration sensor output and communicates the associated vibration data to a programmable controller/computer that is responsive to a simple software algorithm stored therein. The data acquisition system acquires data often enough to determine the maximum amplitude at resonance peaks, that depends on the width of the resonance (damping) and also on the speed of the sweep. The controller/computer compares the acquired vibration level versus speed/frequency data against stored engineering specification data. Frequency bands over which the specification is exceeded may then be determined in response to the algorithmic software. These frequency bands are communicated back to the VFD as lockout/stop/skip frequency bands such that the respective refrigeration or air conditioning system will operate at frequencies only outside the lockout/stop/skip band frequencies.

Any of aspects 1 to 10 can be combined with any of aspects 11 to 23, and any of aspects 11 to 18 can be combined with any of aspects 19 to 23.

Aspect 1. A variable speed cooling system vibration control system, comprising: at least one variable speed motor; a variable speed drive (VFD) for controlling the speed of at least one variable speed motor; and a programmable controller in communication with the VFD and programmed to command the VFD to operate at frequencies only outside of one or more frequency lockout bands automatically calculated by the programmable controller based on a comparison of newly acquired variable speed cooling system vibration data with previously stored variable speed cooling system vibration specification data.

Aspect 2. The variable speed cooling system vibration control system according to aspect 1, further comprising: one or more vibration sensors installed at predetermined locations on the variable speed cooling system; and a vibration data acquisition system configured to acquire vibration level data associated with at least one vibration sensor in response to a desired VFD frequency sweep commanded by the programmable controller.

Aspect 3. The variable speed cooling system vibration control system according to aspect 1 or 2, wherein the newly acquired variable speed cooling system vibration data corresponds to the vibration level data generated via the vibration data acquisition system during the desired VFD frequency sweep.

Aspect 4. The variable speed cooling system vibration control system according to aspect 2 or 3, wherein at least one predetermined location comprises a variable speed fan motor.

Aspect 5. The variable speed cooling system vibration control system according to any of aspects 2 to 4, wherein at least one predetermined location comprises a variable speed compressor motor.

Aspect 6. The variable speed cooling system vibration control system according to any of aspects 2 to 5, wherein at least one predetermined location comprises a refrigerant tubing elbow.

Aspect 7. The variable speed cooling system vibration control system according to any of aspects 1 to 6, wherein the programmable controller is further programmed with expert rules to detect predetermined cooling system faults and generate fault data in response thereto.

Aspect 8. The variable speed cooling system vibration control system according to aspect 7, wherein the predetermined cooling system faults comprise a fan out of balance fault when a fan becomes unbalanced.

Aspect 9. The variable speed cooling system vibration control system according to aspect 7 or 8, wherein the predetermined cooling system faults comprise a bad or missing transducer fault when a predetermined transducer is bad or missing.

Aspect 10. The variable speed cooling system vibration control system according to any of aspects 7 to 9, wherein the predetermined cooling system faults comprise a loose transducer fault when a predetermined transducer is loose.

Aspect 11. A variable speed cooling system vibration control system, comprising: a variable speed cooling system, comprising: at least one variable speed motor; a variable speed drive (VFD) for controlling the speed of at least one variable speed motor; and a programmable controller in communication with the VFD and programmed to command the VFD to operate at frequencies only outside of one or more frequency lockout bands automatically calculated by the programmable controller based on a comparison of newly acquired variable speed cooling system vibration level data with previously stored variable speed cooling system vibration specification data; one or more vibration sensors mounted at predetermined locations on the variable speed cooling system; and a vibration data acquisition system configured to acquire vibration level data associated with at least one vibration sensor in response to a desired VFD frequency sweep commanded by the programmable controller and to communicate the acquired vibration level data to the programmable controller when polled by the programmable controller to retrieve the newly acquired vibration level data.

Aspect 12. The variable speed cooling system vibration control system according to aspect 11, wherein at least one predetermined location comprises a variable speed fan motor.

Aspect 13. The variable speed cooling system vibration control system according to aspect 11 or 12, wherein at least one predetermined location comprises a variable speed compressor motor.

Aspect 14. The variable speed cooling system vibration control system according to any of aspect 11 to 13, wherein at least one predetermined location comprises a refrigerant tubing elbow.

Aspect 15. The variable speed cooling system vibration control system according to any of aspects 11 to 14, wherein the programmable controller is further programmed with expert rules to detect predetermined cooling system faults and generate fault data in response thereto.

Aspect 16. The variable speed cooling system vibration control system according to aspect 15, wherein the predetermined cooling system faults comprise a fan out of balance fault when a fan becomes unbalanced.

Aspect 17. The variable speed cooling system vibration control system according to aspect 15 or 16, wherein the predetermined cooling system faults comprise a bad or missing transducer fault when a predetermined transducer is bad or missing.

Aspect 18. The variable speed cooling system vibration control system according to any of aspects 15 to 17, wherein the predetermined cooling system faults comprise a loose transducer fault when a predetermined transducer is loose.

Aspect 19. A method of automatically determining variable frequency drive (VFD) skip frequency bands (frequency lockout bands) for vibration control of a variable speed cooling system, the method comprising: performing a frequency sweep over a desired frequency band by a variable speed cooling system VFD in response to commands from a programmable controller integrated with the variable speed cooling system; acquiring vibration amplitude data via a data acquisition system during the frequency sweep from one or more vibration sensors mounted at predetermined locations on the variable speed cooling system; calculating via the programmable controller, frequency lockout bands based on the acquired vibration amplitude data and previously stored vibration amplitude limits; and operating the variable speed cooling system in response to commands from the programmable controller such that the variable speed cooling system operates at frequencies only outside the calculated frequency lockout bands.

Aspect 20. The method according to aspect 19, further comprising generating fault signals upon the occurrence of a predetermined cooling system fault via the programmable controller based on previously stored expert rules to detect the predetermined cooling system faults.

Aspect 21. The method according to aspect 20, wherein the predetermined cooling system faults comprise a fan out of balance fault when a fan becomes unbalanced.

Aspect 22. The method according to any of aspects 20 to 21, wherein the predetermined cooling system faults comprise a bad or missing transducer fault when a predetermined transducer is bad or missing.

Aspect 23. The method according to any of aspects 20 to 22, wherein the predetermined cooling system faults comprise a loose transducer fault when a predetermined transducer is loose.

While the embodiments have been described in terms of various specific embodiments, those skilled in the art will recognize that the embodiments can be practiced with modification within the spirit and scope of the claims.

What is claimed is:

1. A variable speed cooling and acoustic noise control system, comprising:
   at least one variable speed motor;
   a variable speed drive (VFD) for controlling the speed of at least one variable speed motor;
   one or more acoustic noise sensors installed at one or more predetermined locations;
   a data acquisition system that acquires data associated with the at least one acoustic noise sensor, and
   a programmable controller in communication with the VFD and the data acquisition system, wherein the programmable controller:
   directs a VFD frequency sweep wherein the at least one variable speed motor sweeps through a range of frequencies;
   determines one or more frequency lockout bands based on data from the data acquisition system and amplitude limits, and
   commands the VFD to operate the at least one variable speed motor at one or more frequencies outside the one or more frequency lockout bands.

2. The variable speed cooling and acoustic noise control system according to claim 1, wherein the range of frequencies is the full operating frequency range of the at least one variable speed motor.

3. The variable speed cooling and acoustic noise control system according to claim 1, wherein at least one predetermined location comprises a variable speed fan motor.

4. The variable speed cooling and acoustic noise control system according to claim 1, wherein at least one predetermined location comprises a variable speed compressor motor.

5. A variable speed cooling system acoustic noise control system, comprising:
   a variable speed cooling system, comprising:
      at least one variable speed motor;
      a variable speed drive (VFD) for controlling the speed of at least one variable speed motor; and
      a programmable controller in communication with the VFD and programmed to command the VFD to operate at frequencies only outside of one or more frequency lockout bands automatically calculated by the programmable controller based on a comparison of newly acquired variable speed cooling system amplitude level data with previously stored variable speed cooling system specification data;
   one or more acoustic noise sensors mounted at one or more predetermined locations on the variable speed cooling system; and
   a data acquisition system configured to acquire amplitude level data associated with at least one vibration sensor, and in communication with the programmable controller, in response to a desired VFD frequency sweep commanded by the programmable controller and to communicate the acquired vibration level data to the programmable controller when polled by the programmable controller to retrieve the newly acquired vibration level data,
   wherein the programmable controller:
      directs a VFD frequency sweep wherein the at least one variable speed motor sweeps through a range of frequencies,
      polls the vibration data acquisition system to retrieve newly acquired vibration level data,
      determines one or more frequency lockout bands, based on the newly acquired vibration level data from the vibration data acquisition system and variable speed cooling system vibration specification data, and
      commands the VFD to operate the at least one variable speed motor at one or more frequencies outside the one or more frequency lockout bands.

6. The variable speed cooling system acoustic noise control system according to claim 5, wherein the range of frequencies is the full operating frequency range of the at least one variable speed motor.

7. The variable speed cooling system acoustic noise control system according to claim 5, wherein at least one predetermined location comprises a variable speed fan motor.

8. The variable speed cooling system acoustic noise control system according to claim 5, wherein at least one predetermined location comprises a variable speed compressor motor.

9. A method of automatically determining variable frequency drive (VFD) skip frequency bands for acoustic noise control of a variable speed cooling system, the method comprising:
   adjusting the speed of at least one variable speed motor to perform a frequency sweep over a desired frequency band by a variable speed cooling system VFD in response to commands from a programmable controller integrated with the variable speed cooling system;
   acquiring amplitude data via a data acquisition system during the frequency sweep from one or more acoustic noise sensors mounted at predetermined locations on the variable speed cooling system;
   calculating, via the programmable controller, frequency lockout bands based on the acquired amplitude data and previously stored amplitude limits; and
   operating the variable speed cooling system in response to commands from the programmable controller such that at least one variable speed motor of the variable speed cooling system operates at frequencies only outside the calculated frequency lockout bands.

10. The method according to claim 9, wherein the desired frequency band is the full operating frequency range of at least one variable speed motor.

11. The method according to claim 9, wherein at least one predetermined location comprises a variable speed fan motor.

12. The method according to claim 9, wherein at least one predetermined location comprises a variable speed compressor motor.

\* \* \* \* \*